United States Patent
Perel, Sr. et al.

(10) Patent No.: US 10,347,457 B1
(45) Date of Patent: Jul. 9, 2019

(54) DYNAMIC TEMPERATURE CONTROL OF AN ION SOURCE

(71) Applicant: Varian Semiconductor Equipment Associates, Inc., Gloucester, MA (US)

(72) Inventors: Alexander S. Perel, Sr., Danvers, MA (US); David P. Sporleder, Billerica, MA (US); Adam M. McLaughlin, Merrimac, MA (US); Craig R. Chaney, Gloucester, MA (US); Neil J. Bassom, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/847,485

(22) Filed: Dec. 19, 2017

(51) Int. Cl.
*H01J 37/02* (2006.01)
*H01J 37/30* (2006.01)

(52) U.S. Cl.
CPC ............ *H01J 37/023* (2013.01); *H01J 37/30* (2013.01); *H01J 37/3007* (2013.01); *H01J 2237/082* (2013.01)

(58) Field of Classification Search
None
See application file for complete search history.

(56) References Cited

U.S. PATENT DOCUMENTS

| | | | | |
|---|---|---|---|---|
| 2,882,406 | A * | 4/1959 | Sloan | H01J 49/126 250/425 |
| 6,818,394 | B1 * | 11/2004 | O'Donnell-Maloney | B01J 19/0046 435/174 |
| 7,815,798 | B2 * | 10/2010 | Schliefer | B05B 17/0646 210/198.2 |
| 8,421,047 | B2 * | 4/2013 | Carmein | H02K 57/003 250/573 |
| 9,142,379 | B2 * | 9/2015 | Koo | H01J 27/02 |
| 2002/0159233 | A1 | 10/2002 | Patel et al. | |

(Continued)

FOREIGN PATENT DOCUMENTS

WO 02/073651 A1 9/2002

OTHER PUBLICATIONS

EML 2322L Desing and Manufacturing Laboratory "Fasteners"—Lab manual.*

(Continued)

*Primary Examiner* — Dion Ferguson
*Assistant Examiner* — Srinivas Sathiraju
(74) *Attorney, Agent, or Firm* — Nields, Lemack & Frame, LLC

(57) ABSTRACT

A system and method for varying the temperature of a faceplate for an ion source is disclosed. The faceplate is held against the chamber walls of the ion source by a plurality of fasteners. These fasteners may include tension springs or compression springs. By changing the length of the tension spring or compression spring when under load, the spring force of the spring can be increased. This increased spring force increases the compressive force between the faceplate and the chamber walls, creating improved thermal conductivity. In certain embodiments, the length of the spring is regulated by an electronic length adjuster. This electronic length adjuster is in communication with a controller that outputs an electrical signal indicative of the desired length of the spring. Various mechanisms for adjusting the length of the spring are disclosed.

20 Claims, 10 Drawing Sheets

(56) References Cited

U.S. PATENT DOCUMENTS

| | | | | |
|---|---|---|---|---|
| 2009/0242793 | A1* | 10/2009 | Low | H01J 27/022 |
| | | | | 250/424 |
| 2010/0024841 | A1* | 2/2010 | Koo | H01J 27/02 |
| | | | | 134/1.1 |
| 2011/0143527 | A1* | 6/2011 | Platow | H01J 37/08 |
| | | | | 438/515 |
| 2011/0240877 | A1 | 10/2011 | Benveniste et al. | |
| 2012/0256097 | A1* | 10/2012 | Chaney | H01J 19/14 |
| | | | | 250/396 ML |
| 2013/0072008 | A1* | 3/2013 | Perel | C23C 14/48 |
| | | | | 438/514 |
| 2013/0341761 | A1* | 12/2013 | Sinha | C23C 14/48 |
| | | | | 257/607 |
| 2014/0319369 | A1* | 10/2014 | Koo | H01J 27/02 |
| | | | | 250/424 |
| 2014/0326594 | A1* | 11/2014 | Biloiu | H01J 27/08 |
| | | | | 204/164 |
| 2015/0084496 | A1 | 3/2015 | Kaufman et al. | |
| 2017/0178857 | A1 | 6/2017 | Holden et al. | |
| 2017/0213684 | A1* | 7/2017 | Lee | H01J 27/022 |

OTHER PUBLICATIONS

William Eccles "Tribological Aspects of the Self-Loosening of Threaded Fasteners." Ph D thesis Jul. 2010 (available on net).*

International Search Report and Written Opinion dated Mar. 12, 2019 in corresponding PCT application No. PCT/US2018/057321.

* cited by examiner

DYNAMIC TEMPERATURE CONTROL OF AN ION SOURCE

FIELD

Embodiments of the present disclosure relate to systems and methods for dynamically changing the temperature of an ion source and more particularly, the faceplate of an ion source.

BACKGROUND

The fabrication of a semiconductor device involves a plurality of discrete and complex processes. One such process may utilize an ion beam, which may be extracted from an ion source. In an ion source, a feed gas is energized to form ions. Those ions are then extracted from the ion source through an extraction aperture disposed on a faceplate. The ions are manipulated downstream by a variety of components, including electrodes, acceleration and deceleration stages, and mass analyzers.

As the ions from the feed gas are extracted from the ion source, some of these ions may settle on the faceplate. Additional, neutral gas may also settle on the faceplate. These ions and neutrals may condense and form a deposition. In certain embodiments, the deposition forms along the extraction aperture. In these embodiments, the uniformity of the ion beam extracted through the extraction aperture may be compromised. In other embodiments, the deposition may form on the front of the faceplate, resulting in increased arcing.

The temperature of the faceplate and the species of feed gas may be factors in determining the amount and rate of deposition on the faceplate. For example, for fluorine-based species, such as $BF_3$ and $GeF_4$, deposition may be enhanced on hotter surfaces. Conversely, for carbon monoxide gas, deposition may be diminished on hotter surfaces.

Therefore, it would be beneficial if there were a system and method for dynamically varying the temperature of the faceplate. Further, it would be advantageous if the dynamic variation were performed based on the species of feed gas that was utilized.

SUMMARY

A system and method for varying the temperature of a faceplate for an ion source is disclosed. The faceplate is held against the chamber walls of the ion source by a plurality of fasteners. These fasteners may include tension springs or compression springs. By changing the length of the tension spring or compression spring when loaded, the spring force of the spring can be increased. This increased spring force increases the compressive force between the faceplate and the chamber walls, creating improved thermal conductivity. In certain embodiments, the length of the spring is regulated by an electronic length adjuster. This electronic length adjuster is in communication with a controller that outputs an electrical signal indicative of the desired length of the spring. Various mechanisms for adjusting the length of the spring are disclosed.

According to one embodiment, an ion source is disclosed. The ion source comprises a plurality of chamber walls; a faceplate disposed against the chamber walls using compressive force; and one or more fasteners to secure the faceplate against the chamber walls; wherein the compressive force applied by the fasteners to the faceplate can be electronically varied. In certain embodiments, the ion source comprises an indirectly heated cathode. In certain embodiments, the fasteners comprises a fastening device and a force adjuster. In certain embodiments, the force adjuster comprises a spring and an electronic length adjuster to adjust a length of the spring when under load. The electronic length adjuster may be a piezoelectric actuator; a solenoid; a pneumatic cylinder; a servo motor and a ball screw; and a servo motor and an arm, wherein a proximal end of the arm is attached to a rotating portion of the servo motor. The spring may be a tension spring or a compression spring.

According to another embodiment, an apparatus is disclosed. The apparatus comprises an ion source, comprising a plurality of chamber walls; a faceplate disposed against the chamber walls; and one or more fasteners to secure the faceplate against the chamber walls; and a controller, in communication with the fasteners to adjust a compressive force applied by the fasteners to the faceplate. In certain embodiments, the fasteners comprise a spring, and an electronic length adjuster, in communication with the controller, to adjust a length of the spring when under load. In certain embodiments, the controller adjusts the compressive force based on a species of feed gas introduced into the ion source. In certain embodiment, the controller comprises an input device, and the controller adjusts the compressive force based on input received from the input device.

According to another embodiment, an ion source is disclosed. The ion source comprises a plurality of chamber walls; and a faceplate disposed against the chamber walls; wherein a temperature of the faceplate is electronically adjustable by varying a thermal conductivity between the faceplate and the chamber walls. In certain embodiments, the ion source also comprises a controller, wherein the controller adjusts the thermal conductivity by modifying a compression force between the faceplate and the chamber walls. In certain embodiments, the faceplate is held against the chamber walls by a spring and an electronic length adjuster, wherein the electronic length adjuster adjusts a length of the spring when under load, and the controller modifies the compression force using the electronic length adjuster. In some embodiments, the compression force is selected based on a feed gas introduced into the ion source.

BRIEF DESCRIPTION OF THE FIGURES

For a better understanding of the present disclosure, reference is made to the accompanying drawings, which are incorporated herein by reference and in which.

DETAILED DESCRIPTION

As described above, deposition may occur on the faceplate of an ion source. This deposition may shorten the lifetime of the ion source, affect the uniformity of the ion beam, increase the glitch rate, or otherwise negatively impact the ion source.

Figure 1:
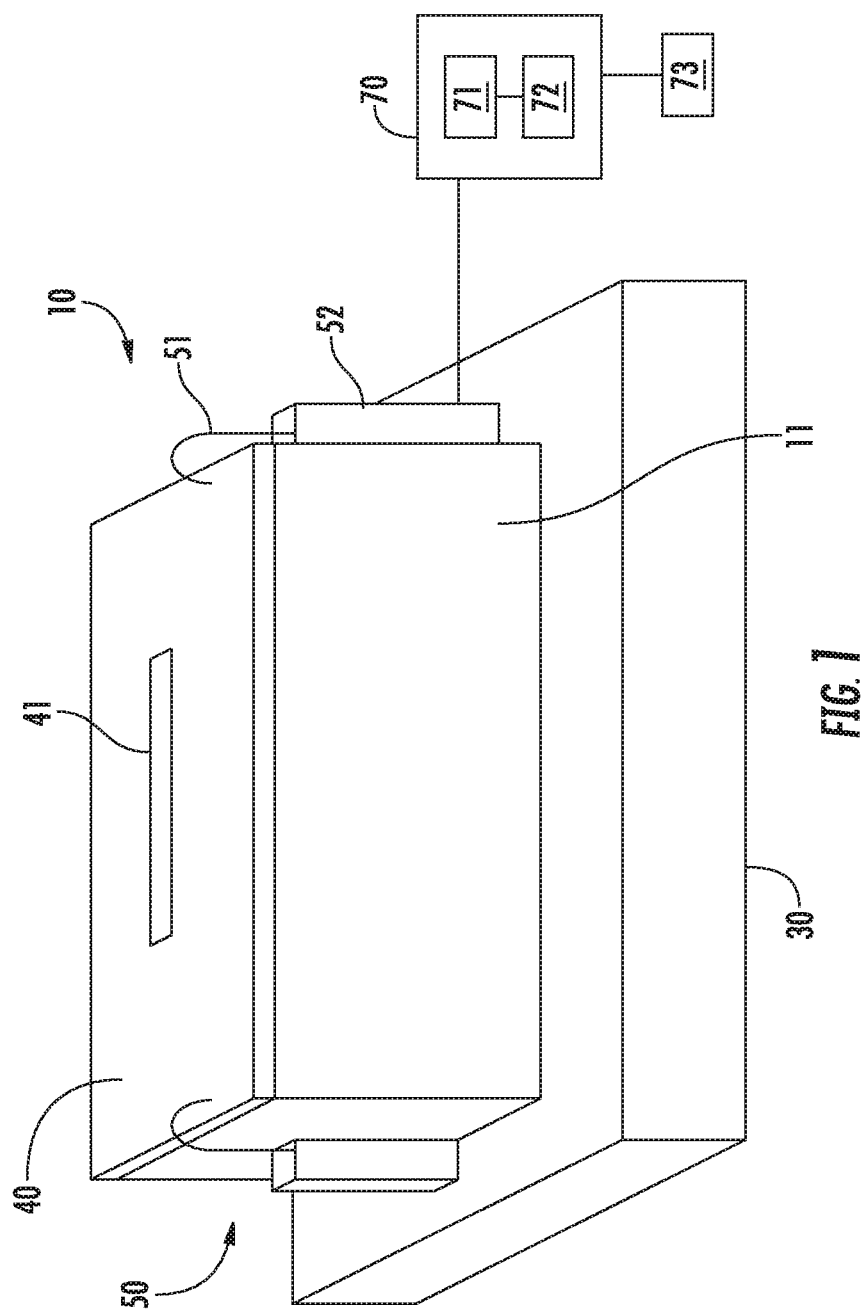
FIG. 1 is a view of the ion source according to one embodiment.

By dynamically varying the temperature of the faceplate of the ion source, the amount and rate of deposition may be affected. FIG. 1 shows an ion source that allows temperature variation of the faceplate according to one embodiment. The ion source 10 includes a plurality of chamber walls 11 that define an ion source chamber. A faceplate 40 having an extraction aperture 41 may be disposed against the chamber walls 11. The faceplate 40 may be a single component, or may be comprised of a plurality of components. For example, in one embodiment, the faceplate 40 includes a faceplate insert that is disposed beneath the outer faceplate and helps define the extraction aperture 41. Thus, the term "faceplate" as used in this disclosure refers to any component or components that make up the structure that includes the extraction aperture through which the ions are removed. Within the ion source chamber may be a mechanism to create ions. For example, in one embodiment, an indirectly heated cathode (IHC) may be disposed within the ion source chamber.

Figure 2:
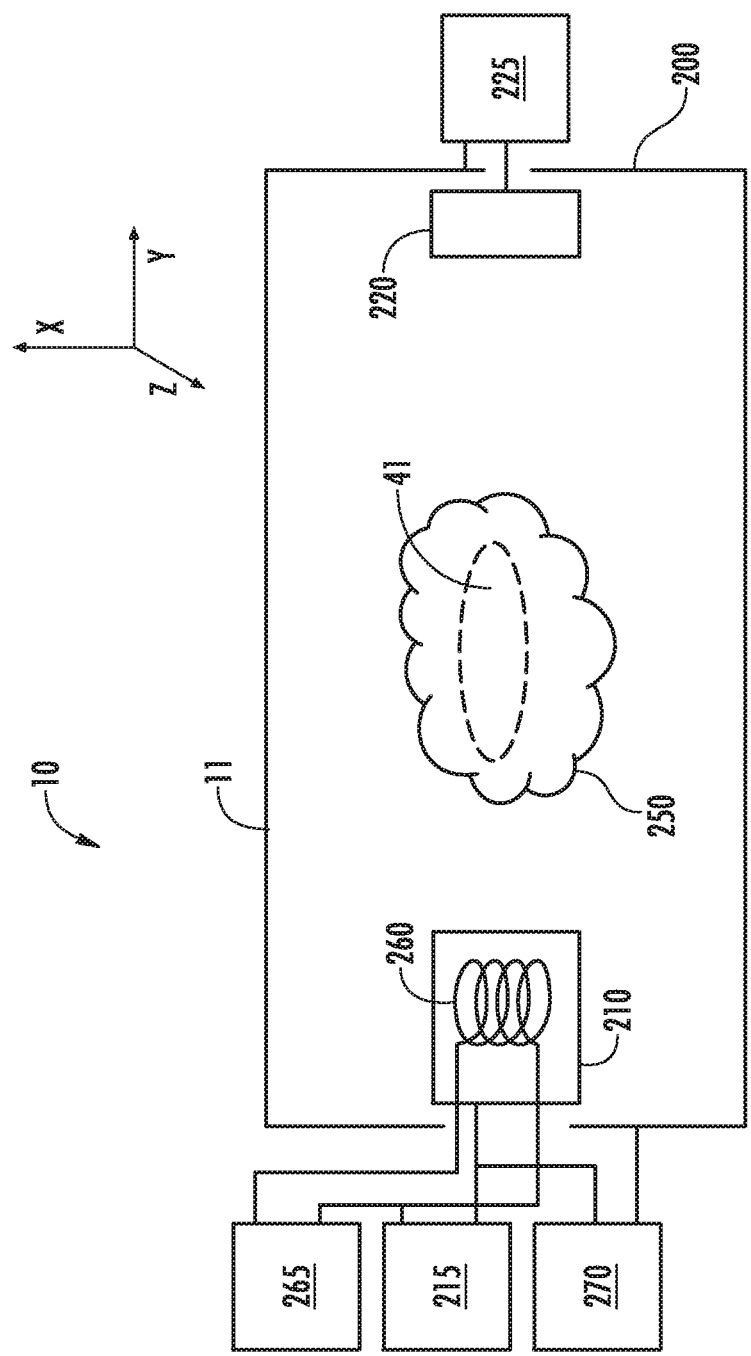
FIG. 2 is a view of the interior of the ion source of FIG. 1.

FIG. 2 shows the electronics and interior of the ion source 10 according to one embodiment. In this embodiment, the ion source 10 includes a chamber 200, comprising two opposite ends, and chamber walls 11 connecting to these ends. The chamber 200 also includes a bottom wall and faceplate 40. The chamber walls may be constructed of an electrically and thermally conductive material and may be in electrical communication with one another. A cathode 210 is disposed in the chamber 200 at a first end of the chamber 200. A filament 260 is disposed behind the cathode 210. The filament 260 is in communication with a filament power supply 265. The filament power supply 265 is configured to pass a current through the filament 260, such that the filament 260 emits thermionic electrons. Cathode bias power supply 215 biases filament 260 negatively relative to the cathode 210, so these thermionic electrons are accelerated from the filament 260 toward the cathode 210 and heat the cathode 210 when they strike the back surface of cathode 210. The cathode bias power supply 215 may bias the filament 260 so that it has a voltage that is between, for example, 200V to 1500V more negative than the voltage of the cathode 210. The cathode 210 then emits thermionic electrons on its front surface into chamber 200.

Thus, the filament power supply 265 supplies a current to the filament 260. The cathode bias power supply 215 biases the filament 260 so that it is more negative than the cathode 210, so that electrons are attracted toward the cathode 210 from the filament 260. Additionally, the cathode 210 is electrical biased relative to the chamber 200, using cathode power supply 270.

In this embodiment, a repeller 220 is disposed in the chamber 200 on the second end of the chamber 200 opposite the cathode 210. The repeller 220 may be in communication with repeller power supply 225. As the name suggests, the repeller 220 serves to repel the electrons emitted from the cathode 210 back toward the center of the chamber 200. For example, the repeller 220 may be biased at a negative voltage relative to the chamber 200 to repel the electrons. For example, the repeller power supply 225 may have an output in the range of 0 to −150V, although other voltages may be used. In certain embodiments, the repeller 220 is biased at between 0 and −150V relative to the chamber 200. In other embodiments, the cathode power supply 270 is used to supply a voltage to the repeller 220 as well. In other embodiments, the repeller 220 may be grounded or floated.

In operation, a gas is supplied to the chamber 200. The thermionic electrons emitted from the cathode 210 cause the gas to form a plasma 250. Ions from this plasma 250 are then extracted through an extraction aperture 41 in the faceplate 40. The ions are then manipulated to form an ion beam that is directed toward the workpiece.

It is noted that other mechanisms for generating ions may be used. These other mechanisms include, but are not limited to, Bernas ion source, RF antennas, and capacitively coupled sources.

Returning to FIG. 1, the ion source 10 may be attached to a baseplate 30. In certain embodiments, the baseplate 30 may be temperature controlled. For example, the baseplate 30 may be attached to a heat sink, or may be a heat sink itself. Thus, the chamber walls 11 are in direct thermal contact with the baseplate 30. This may serve to cool the chamber walls 11.

The faceplate 40 is disposed against the top of the chamber walls 11, via a plurality of fasteners 50. Each of these fasteners comprise a fastening device 51, such as a hook, that is affixed to the top of the faceplate 40, and a force adjuster 52, which is attached to the fastening device 51 and the baseplate 30. In other embodiments, the force adjuster 52 may be attached to the fastening device 51 and another stationary surface, such as the chamber walls 11. The fasteners 50 serve to secure the faceplate 40 against the chamber walls 11.

The force adjuster 52 may be in communication with a controller 70. The controller 70 has a processing unit 71 and an associated memory device 72. This memory device 72 contains the instructions, which, when executed by the processing unit 71, enable the controller 70 to perform the functions described herein. This memory device 72 may be a non-volatile memory, such as a FLASH ROM, an electrically erasable ROM or other suitable devices. In other embodiments, the memory device 72 may be a volatile memory, such as a RAM or DRAM. The processing unit 71 may be a general purpose computer, a special purpose computer, a microcontroller or another type of electrical circuit. The controller 70 may output one or more electrical signals to the force adjuster 52, as described in more detail below. The controller 70 may also be in communication with a user interface or other input device 73. The controller 70 may receive input from the input device 73, as described below.

The force adjuster 52 is used to vary the force of compression between the faceplate 40 and the top of the chamber walls 11. In certain embodiments, the force adjuster 52 is able to vary the force applied by the fastening device 51 on the faceplate 40 through the use of a tension spring. As the tension spring is stretched, its spring force increases linearly with its length. Thus, by stretching a tension spring, the downward force exerted by the fastening device 51 on the faceplate 40 may be varied. In other embodiments, a tension spring may not be used.

In all embodiments, the system comprises an ion source 10 having a plurality of chamber walls 11 and a faceplate 40 disposed on the tops of the chamber walls 11. A plurality of fasteners 50 are used to hold the faceplate 40 against the chamber walls 11. The fasteners 50 may be attached to the faceplate 40 at one end and the baseplate 30 or another stationary object at the opposite end. The fasteners 50 are able to dynamically vary the compression force applied to the faceplate 40. In some embodiments, a controller 70 is in communication with the fastener 50 to control the compression force that is exerted by the fastener 50.

As noted above, in certain embodiments, the controller 70 is in communication with an input device 73, such as a touchscreen, a keyboard or a mouse. In certain embodiments, the input device 73 may be an interface to another controller. In this embodiment, the user or operator may be able to select a desired compression force using the input device 73. Based on the input, the controller 70 may output one or more electrical signals to the force adjuster 52 to vary the compression force being applied to the faceplate 40.

For example, in certain embodiments, it may be preferable to have the faceplate 40 at a lower temperature when the feed gas is a fluorine-containing species. Since the chamber walls 11 are attached to the baseplate 30, the chamber walls 11 may be at a lower temperature than the faceplate 40. By increasing the compressive force applied to the faceplate 40, the thermal contact between the faceplate 40 and the chamber walls 11 may be improved. This improvement in thermal contact increases the thermal conductivity, resulting in a lower temperature for the faceplate 40. In other embodiments, it may be beneficial to increase the temperature of the faceplate 40. By decreasing the compressive force applied to the faceplate 40, the thermal conductivity between the faceplate 40 and the chamber walls 11 is reduced, causing the temperature of the faceplate 40 to increase.

Through the use of an electrically controlled force adjuster 52, these temperature changes to the faceplate 40 can be made dynamically without having to break vacuum or physically access any components.

In certain embodiments, there may be a minimum acceptable compressive force. This minimum acceptable compressive force may be the minimum force needed to hold the faceplate 40 in position without the risk of misalignment. Similarly, there may be a maximum acceptable compressive force. For example, forces greater than this maximum acceptable compressive force may not improve the thermal conductivity between the faceplate 40 and the chamber walls 11.

Thus, in certain embodiments, the electrically controlled force adjuster 52 may be able to achieve forces that are between the minimum acceptable compressive force and the maximum acceptable compressive force. In some embodiments, the electrically controlled force adjuster 52 may be able to apply a plurality of compressive forces that are between these two extremes.

FIGS. 3-7 illustrate embodiments of the force adjuster that utilize a tension spring. The tension spring is used in conjunction with an electronic length adjuster, which varies the length of the tension spring when it is under load, thus changing its spring force.

Figure 3:
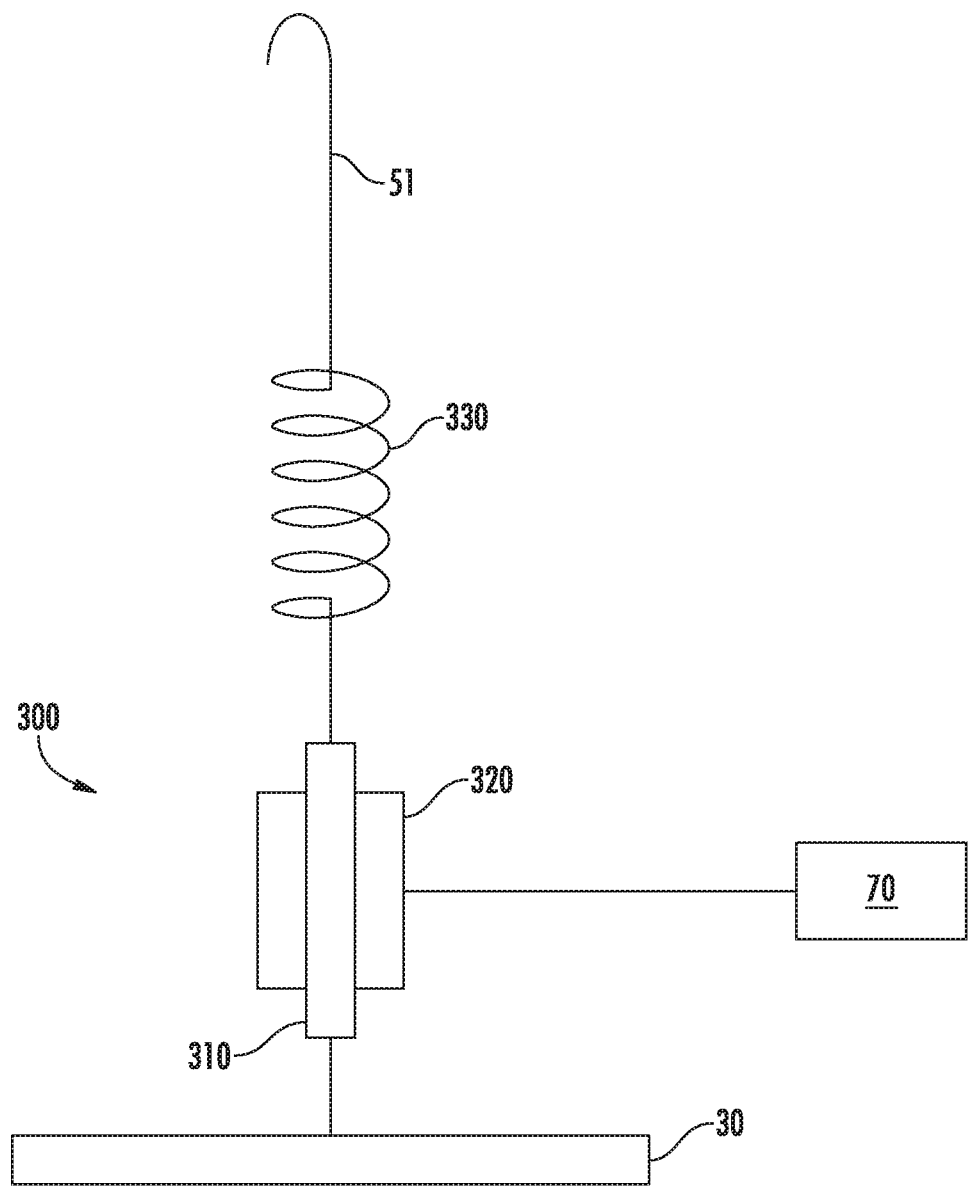
FIG. 3 is a force adjuster according to one embodiment.

FIG. 3 shows a first embodiment where the electronic length adjuster 300 comprises one or more piezoelectric actuators 310. The electronic length adjuster 300 is attached to a tension spring 330 on one of its ends. The opposite end is attached to the baseplate 30 or another stationary object. In this embodiment, the controller 70 applies one or more voltages to the electrodes 320 in the piezoelectric actuators 310. These voltages create an electric field, which causes the piezoelectric actuators 310 to change in length. The change in the length of the piezoelectric actuators is related to the voltage applied to the electrodes 320. The electronic length adjuster 300 may be configured such that the lowest voltage that can be applied to the electrodes 320 results in the maximum allowable compressive force. Higher voltages cause the piezoelectric actuators 310 to expand in length, decreasing the compressive force. A number of piezoelectric actuators 310 may be connected in series to increase the maximum change in length that can be achieved by the electronic length adjuster 300 in this embodiment. Because the change in length is related to the applied voltage, the electronic length adjuster 300 in this embodiment is capable of providing a range of spring forces.

Figure 4:
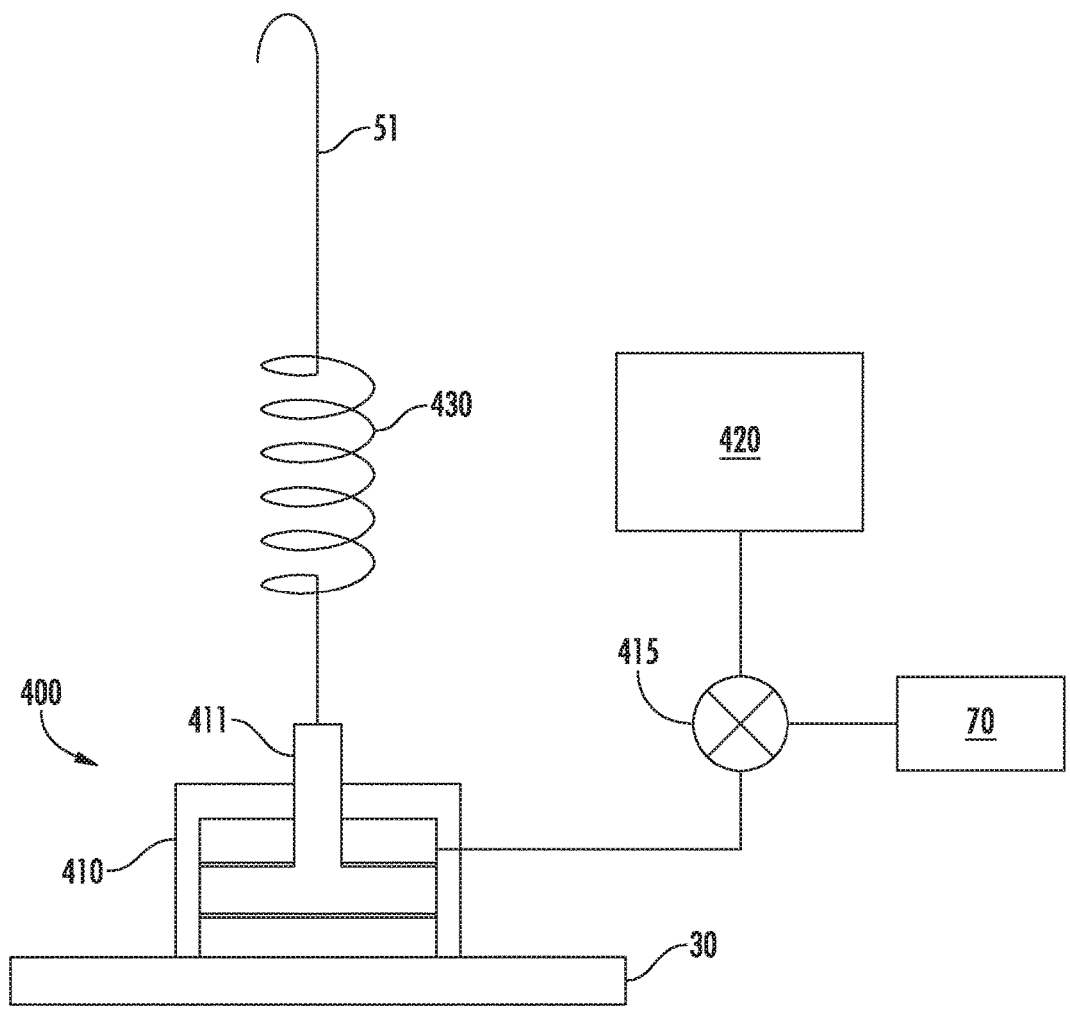
FIG. 4 is a force adjuster according to a second embodiment.

FIG. 4 shows a second embodiment where the electronic length adjuster 400 comprises a pneumatic cylinder 410. The pneumatic cylinder 410 may be attached to the baseplate 30 or another stationary object. The piston 411 in the pneumatic cylinder 410 may be attached to the tension spring 430. The controller 70 may be in communication with a valve 415 that is disposed between the pneumatic cylinder 410 and a gas container 420. When the valve 415 is open, compressed gas from the gas container 420 flows to a volume within the pneumatic cylinder 410. This compressed gas causes the piston 411 in the pneumatic cylinder to be pushed away from the tension spring 430, increasing the length of the tension spring 430. When the compressed gas is removed from the volume, the piston 411 moves away from the baseplate 30, decreasing the length of the tension spring 430. The valve 415 may be controlled by the controller 70. While FIG. 4 shows the pneumatic cylinder 410 as a single-acting cylinder, it is understood that a double acting cylinder may be used in certain embodiments. Because the position of the piston 411 is related to the amount of compressed gas in the volume, the electronic length adjuster 400 in this embodiment is capable of providing a range of spring forces.

Figure 5:
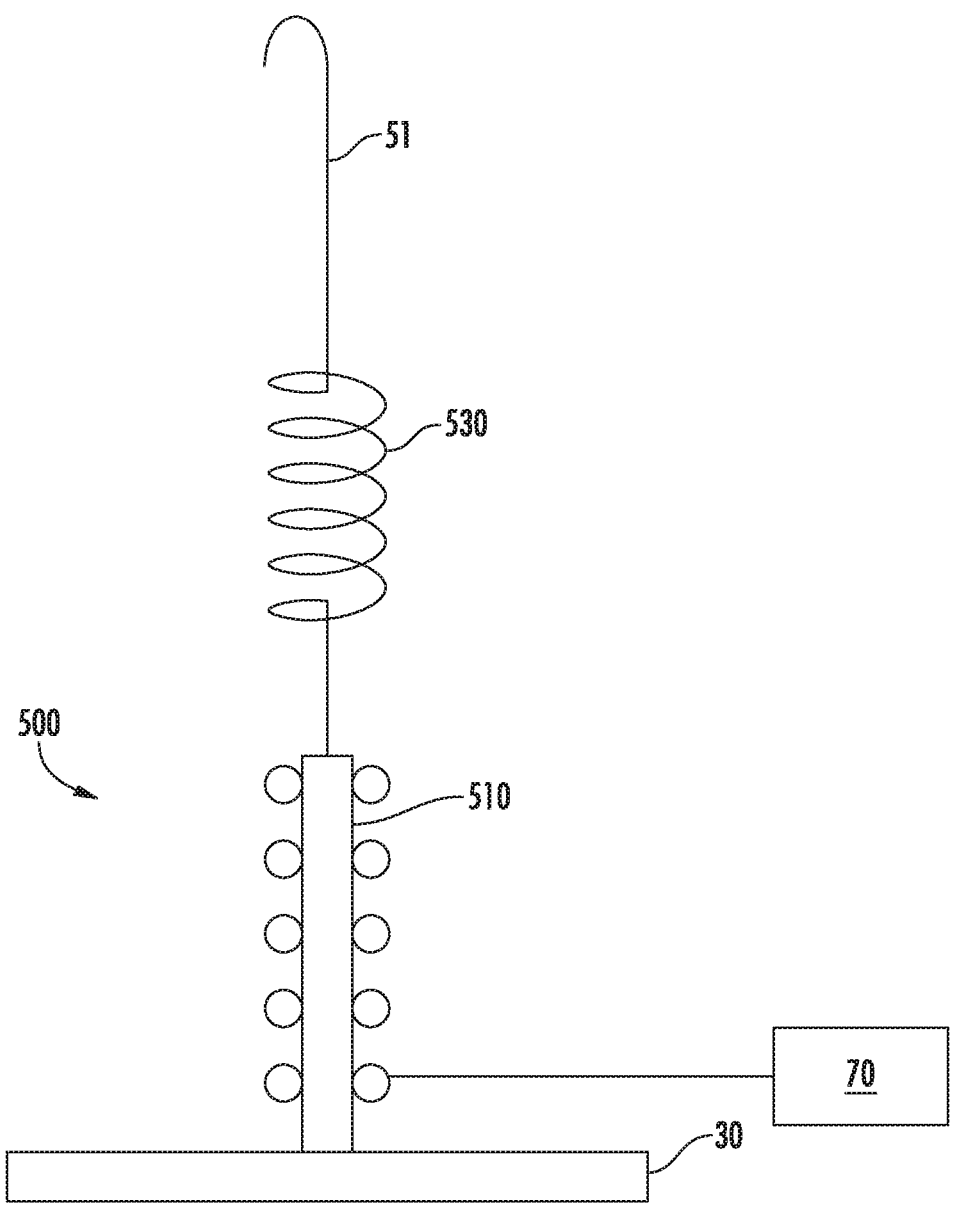
FIG. 5 is a force adjuster according to a third embodiment.

FIG. 5 shows a third embodiment where the electronic length adjuster 500 comprises a solenoid 510. One end of the solenoid is attached to the baseplate 30 or another stationary object. The opposite end of the solenoid 510 may be attached to the tension spring 530. The controller 70 may provide an electrical signal to the solenoid 510. In one state, the solenoid 510 moves to an expanded state, which reduces the length of the tension spring 530. This lowers the spring force, and consequently lowers the compressive force on the faceplate 40. In the second state, the solenoid 510 moves to a contracted state, which increases the length of the tension spring 530. This increases the spring force, and consequently the compressive force applied to the faceplate 40. Since a solenoid has exactly two states, in this embodiment, the electronic length adjuster 500 is capable of achieving two different lengths.

Figure 6:
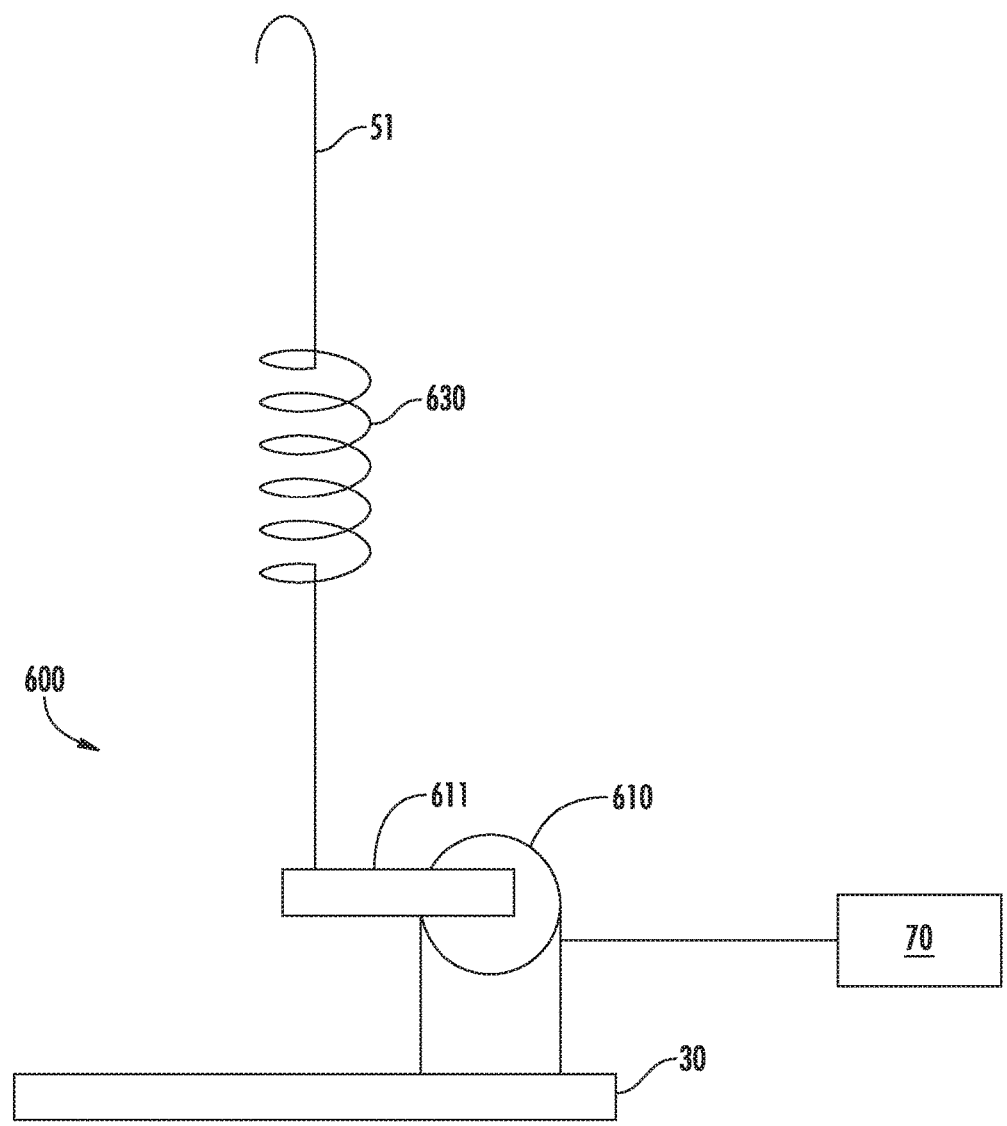
FIG. 6 is a force adjuster according to a fourth embodiment.

FIG. 6 shows a fourth embodiment where the electronic length adjuster 600 comprises a servo motor 610. The rotating portion of the servo motor 610 may be in communication with the proximal end of a rotatable arm 611. The servo motor 610 may be mounted on the baseplate 30 or another stationary object. The distal end of the rotatable arm 611 may be attached to the tension spring 630. The controller 70 may be in communication with the servo motor 610, causing the servo motor 610 to rotate about its rotational axis. This, in turn, rotates the rotatable arm 611. When the distal end of the rotatable arm 611 is furthest from the baseplate 30, the length of the tension spring 630 is minimized, and consequently, the compressive force on the faceplate 40 is reduced. As the rotatable arm 611 is rotated, the distal end nears the baseplate 30, which increases the length of the tension spring 630. Because the change in length is related to the rotational angle of the rotatable arm 611, the electronic length adjuster 600 in this embodiment is capable of providing a range of spring forces.

Figure 7:
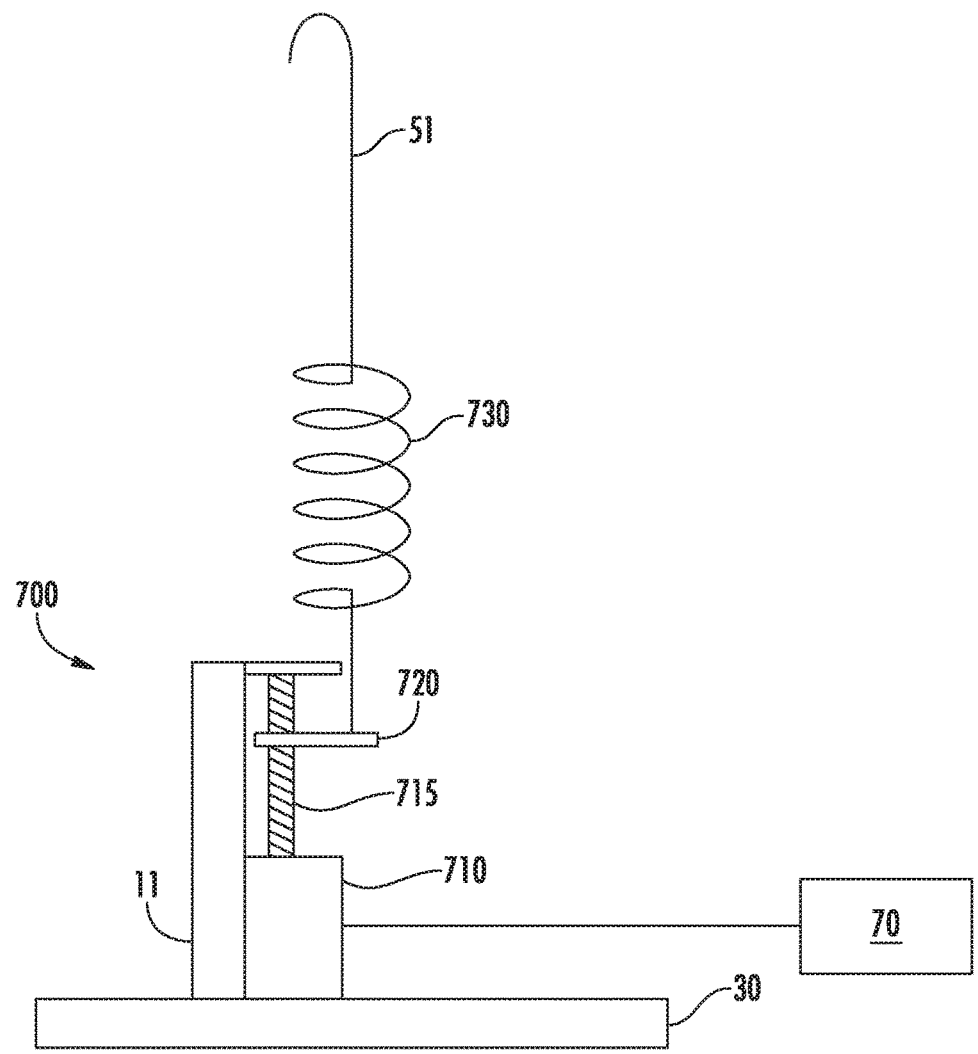
FIG. 7 is a force adjuster according to a fifth embodiment.

FIG. 7 shows a fifth embodiment where the electronic length adjuster 700 comprises a servo motor 710, a ball screw 715 and a ball screw nut bracket 720. The servo motor 710 may be in communication with the controller 70. The servo motor 710 rotates a ball screw 715, which may be oriented vertically. A ball screw nut bracket 720 is mounted on the ball screw 715 and moves in the vertical direction, based on the rotation of the ball screw 715. The ball screw 715 may be supported by a wall, such as the chamber wall 11. A tension spring 730 may be attached to the ball screw nut bracket 720. In this way, when the ball screw nut bracket 720 is moved downward in the vertical direction, the length of the tension spring 730 is increased, increasing its spring force. Conversely, when the ball screw nut bracket 720 is moved upward, the length of the tension spring 730 is reduced, decreasing its spring force. Because the change in length is related to the rotation of the ball screw 715, the electronic length adjuster 700 in this embodiment is capable of providing a range of spring forces.

Figure 8:
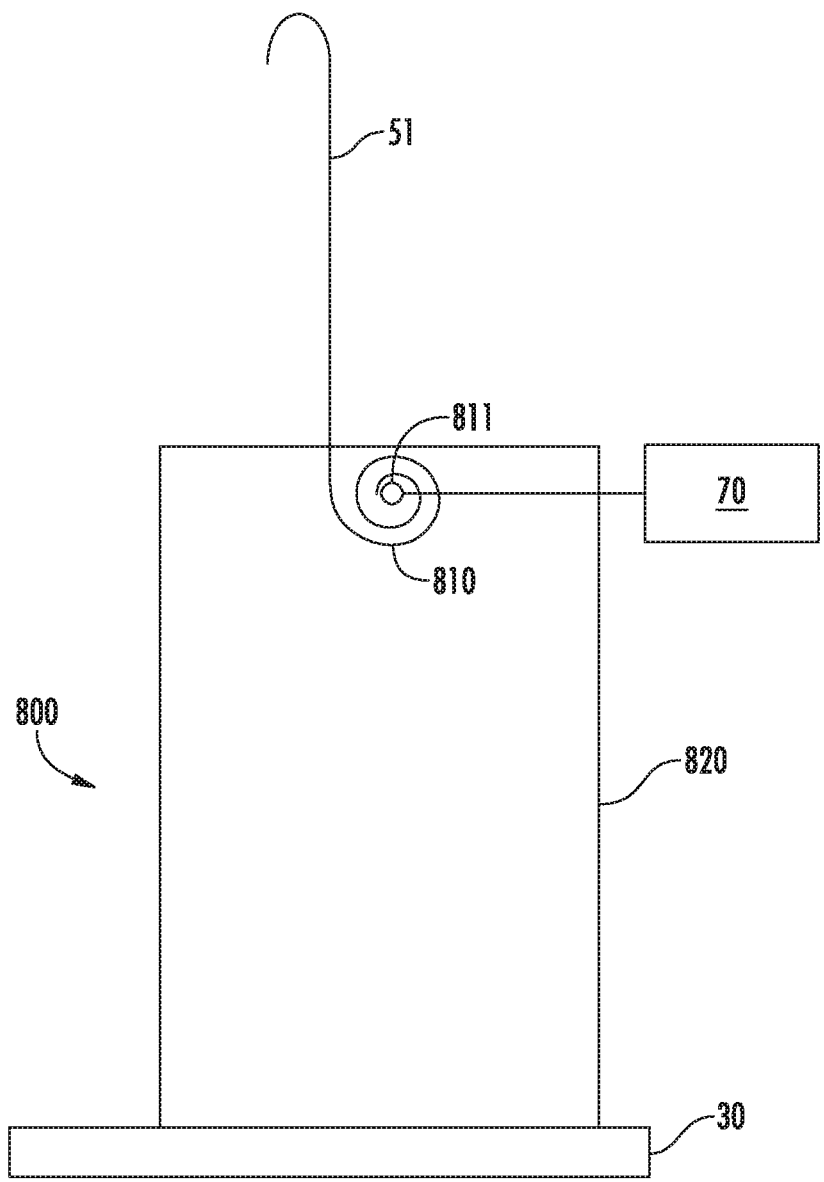
FIG. 8 is a force adjuster according to a sixth embodiment.

FIG. 8 shows another embodiment in which the force adjuster does not employ a tension spring. In this embodiment, the force adjuster 800 comprises a windable coil spring 810. The inner end of the windable coil spring 810 is attached to a rod 811, which can be rotated by the controller 70. The outer end of the windable coil spring 810 may be attached to the fastening device 51. As the windable coil spring 810 is wound tighter, the tension in the windable coil spring 810 increases, increasing the compressive force on the faceplate 40. As the windable coil spring 810 is unwound, the tension is reduced, reducing the compressive force on the faceplate 40. In certain embodiments, the windable coil spring 810 may be disposed within a housing 820, which is affixed to the baseplate 30 or another stationary object. Because the change in tension is related to the rotational angle of the rod 811, the force adjuster 800 in this embodiment is capable of providing a range of compressive forces.

While FIGS. 3-7 all show the use of a tension spring, it is understood that a compression spring may be used in any of these embodiments. Without reproducing all of the above embodiments, the use of a compression spring with the embodiment of FIG. 4 is presented as an example. One skilled in the art can readily understand how a compression spring may be used with the other embodiments.

Figure 9:
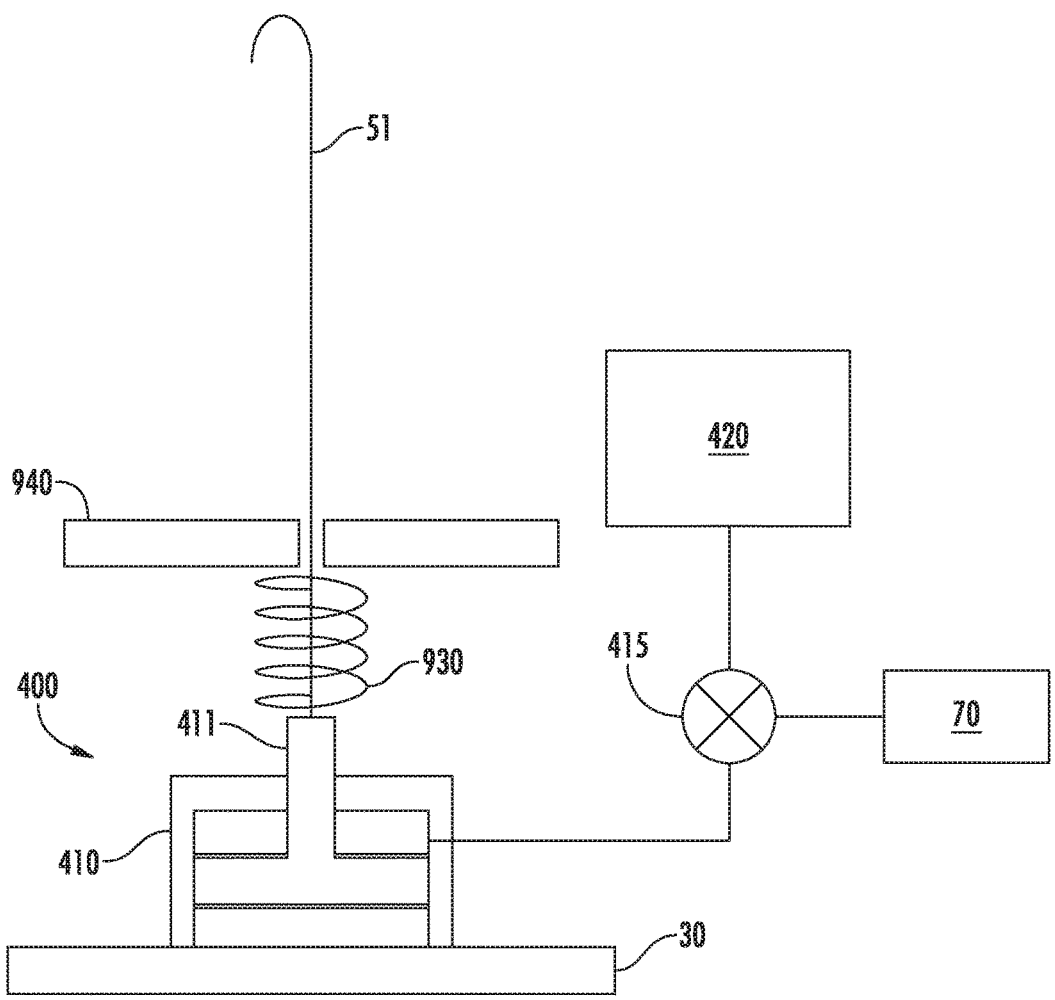
FIG. 9 shows the embodiment of FIG. 4, where a compression spring is employed.

FIG. 9 shows the embodiment of FIG. 4, where a compression spring 930 is employed. Elements that are common with the embodiment of FIG. 4 are given identical reference designators. In this embodiment, the fastening device 51 is attached to the piston 411. A compression spring 930 is disposed between the pneumatic cylinder 410 and a rigid structure 940, such as a fixed wall. As the piston 411 is moved, the length of the compression spring 930 is varied.

Thus, like the embodiments of FIGS. 3-7 that utilize a tension spring, the electronic length adjusters described herein may also be used with a compression spring.

Furthermore, in certain embodiments, the embodiments shown in FIGS. 3-7 may be employed without the use of a spring. In these embodiments, the electronic length adjusters act as a force adjuster 52 (see FIG. 1). For example, in FIG. 3, the one or more piezoelectric actuators 310 may act as a force adjuster, varying the force being applied to the faceplate 40. In FIG. 4, the pneumatic cylinder 410 may act as the force adjuster. In FIG. 5, the solenoid 510 may act as the force adjuster. In FIG. 6, the servo motor 610 may act as the force adjuster. Finally, in FIG. 7, the servo motor 710, ball screw 715 and ball screw nut bracket 720 may act as the force adjuster.

In operation, the user or operator may determine the species of feed gas that will be introduced into the chamber 200. The choice of feed gas may indicate that a particular temperature is preferable for the faceplate 40. For example, as described above, a fluorine-containing species may benefit from a cooler faceplate 40. Thus, in this case, the compressive force applied to the faceplate 40 is increased, making improved thermal contact with the chamber walls 11. This reduces the temperature of the faceplate 40. Conversely, carbon monoxide gas may benefit from a hotter faceplate 40. Thus, in this case, the compressive force applied to the faceplate 40 is decreased, degrading the thermal contact with the chamber walls 11. In one embodiment, the controller 70 outputs one or more electrical signals to the fasteners 50 and more particularly, the force adjuster 52, based on the selection of the feed gas. In another embodiment, the user or operator may indicate to the controller 70 a desired setting. In one embodiment, there may be two settings: hot and cool. In other embodiments, there may be a plurality of settings. The controller 70 then outputs the appropriate electrical signals based on the inputted setting.

Figure 10:
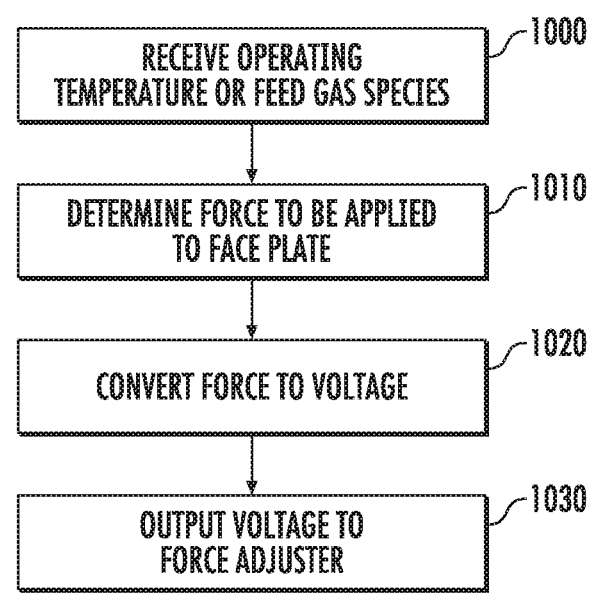
FIG. 10 shows the operation of the controller according to one embodiment.

FIG. 10 shows a flowchart illustrating this sequence. As shown in Box 1000, the controller 70 receives input from the input device 73. This input may be the desired operating temperature of the faceplate 40 or the species of the feed gas to be used. Based on this input, the controller 70 determines the compressive force to be applied to the faceplate 40, as shown in Box 1010. This compressive force is then converted to a voltage, as shown in Box 1020. In certain embodiments, the controller may utilize a table that includes force and corresponding voltage. In other embodiments, the controller 70 may use an equation to convert force to voltage. In certain embodiments, the controller 70 may convert the input from the input device 73 directly to a voltage without an intermediate process of determining the compressive force. After the voltage has been determined, this voltage is then applied to the force adjuster 52, as shown in Box 1030.

The system and method described herein have many advantages. As noted above, it was been found that deposition on the faceplate of an ion source may be a function of the species of feed gas and the temperature of the faceplate. By varying the temperature of the faceplate, deposition may be reduced. Additionally, the present system allows for the temperature to be varied without breaking vacuum or physically accessing any components. In one test, it was found that doubling the spring force of the tension spring reduced the temperature of the faceplate by 70° C. Thus, by varying the force of compression between the chamber walls and the faceplate, the temperature of the faceplate can be manipulated, leading to improved performance and longer operation between preventative maintenance processes. Furthermore, the present system allows the feed gas within the ion source to be changed without having to physically change the configuration of the ion source.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
a plurality of chamber walls;
a faceplate disposed against the chamber walls using compressive force; and
one or more fasteners to secure the faceplate against the chamber walls; wherein the compressive force applied by the fasteners to the faceplate can be electronically varied to adjust a temperature of the faceplate.

2. The ion source of claim 1, wherein the ion source comprises an indirectly heated cathode.

3. The ion source of claim 1, wherein the fasteners comprise a fastening device and a force adjuster.

4. The ion source of claim 3, wherein the force adjuster comprises a spring and an electronic length adjuster to adjust a length of the spring when under load.

5. The ion source of claim 4, wherein the electronic length adjuster comprises a piezoelectric actuator.

6. The ion source of claim 4, wherein the electronic length adjuster comprises a solenoid.

7. The ion source of claim 4, wherein the electronic length adjuster comprises a servo motor and an arm, wherein a proximal end of the arm is attached to a rotating portion of the servo motor.

8. The ion source of claim 4, wherein the electronic length adjuster comprises a pneumatic cylinder.

9. The ion source of claim 4, wherein the electronic length adjuster comprises a servo motor and a ball screw.

10. The ion source of claim 4, wherein the spring comprises a tension spring.

11. The ion source of claim 4, wherein the spring comprises a compression spring.

12. The ion source of claim 3, wherein the force adjuster is selected from the group consisting of a windable coil spring; a piezoelectric actuator; a solenoid; a pneumatic cylinder; a servo motor and a ball screw; and a servo motor and an arm, wherein a proximal end of the arm is attached to a rotating portion of the servo motor.

13. An apparatus, comprising:
an ion source, comprising:
a plurality of chamber walls;
a faceplate disposed against the chamber walls; and
one or more fasteners to secure the faceplate against the chamber walls; and
a controller, in communication with the fasteners to adjust a compressive force applied by the fasteners to the faceplate.

14. The apparatus of claim 13, wherein the fasteners comprise a spring, and an electronic length adjuster, in communication with the controller, to adjust a length of the spring when under load.

15. The apparatus of claim 13, wherein the controller adjusts the compressive force based on a species of feed gas introduced into the ion source.

16. The apparatus of claim 13, wherein the controller comprises an input device, and the controller adjusts the compressive force based on input received from the input device.

17. An ion source, comprising:
a plurality of chamber walls; and
a faceplate disposed against the chamber walls;
wherein a temperature of the faceplate is electronically adjustable by varying a thermal conductivity between the faceplate and the chamber walls.

18. The ion source of claim 17, further comprising a controller, wherein the controller adjusts the thermal conductivity by modifying a compression force between the faceplate and the chamber walls.

19. The ion source of claim 18, wherein the faceplate is held against the chamber walls by a spring and an electronic length adjuster, wherein the electronic length adjuster adjusts a length of the spring when under load, and the controller modifies the compression force using the electronic length adjuster.

20. The ion source of claim 18, wherein the compression force is selected based on a feed gas introduced into the ion source.

* * * * *